(12) United States Patent
Perng et al.

(10) Patent No.: US 10,638,597 B2
(45) Date of Patent: Apr. 28, 2020

(54) STAND-OFF BLOCK

(71) Applicant: Cisco Technology, Inc., San Jose, CA (US)

(72) Inventors: Shih Fung Perng, Fremont, CA (US); Weidong Xie, San Ramon, CA (US); Nguyet-Anh Nguyen, Fremont, CA (US)

(73) Assignee: Cisco Technology, Inc., San Jose, CA (US)

(*) Notice: Subject to any disclaimer, the term of this patent is extended or adjusted under 35 U.S.C. 154(b) by 0 days.

(21) Appl. No.: 15/948,762

(22) Filed: Apr. 9, 2018

(65) Prior Publication Data

US 2018/0228017 A1    Aug. 9, 2018

Related U.S. Application Data

(62) Division of application No. 15/014,111, filed on Feb. 3, 2016, now Pat. No. 9,980,367, which is a division
(Continued)

(51) Int. Cl.
| | | |
|---|---|---|
| H05K 1/02 | (2006.01) | |
| H05K 3/34 | (2006.01) | |
| H01L 21/58 | (2006.01) | |
| H01L 21/60 | (2006.01) | |
| H01L 23/02 | (2006.01) | |
| H01L 23/28 | (2006.01) | |
| H01L 23/36 | (2006.01) | |
| H01L 23/48 | (2006.01) | |
(Continued)

(52) U.S. Cl.
CPC ......... H05K 1/0213 (2013.01); H05K 3/301 (2013.01); H05K 3/303 (2013.01); *H01L 2924/15311* (2013.01); *H01L 2924/3511* (2013.01); *H05K 3/3436* (2013.01); *H05K 2201/2036* (2013.01); *Y02P 70/613* (2015.11)

(58) Field of Classification Search
CPC ........... H05K 1/10; H05K 1/213; H05K 3/30; H05K 3/34; H05K 3/301; H05K 3/303; H05K 1/02; H01L 21/58; H01L 21/60; H01L 21/058; H01L 23/02; H01L 23/28; H01L 23/36; H01L 23/48; H01L 23/49
USPC ........ 174/250, 260; 257/678, 690, 693, 698, 257/712, 729, 737, 777; 438/117, 121; 439/70; 363/820; 361/820
See application file for complete search history.

(56) References Cited

U.S. PATENT DOCUMENTS 5,760,469 A * 6/1998 Higashiguchi ........ H01L 23/057
  257/678
5,772,451 A * 6/1998 Dozier, II ............ B23K 20/004
  257/E21.503
(Continued)

OTHER PUBLICATIONS

Steven Perng et al., "Precision Height Stand-Off Block with Inline High Speed Placement Machine," SMTA International Conference 2012, Oct. 14-18, 2012, vol. 1 of 2, 25 pgs.

*Primary Examiner* — Xiaoliang Chen
(74) *Attorney, Agent, or Firm* — Merchant & Gould P.C.

(57) ABSTRACT

An apparatus may be provided. The apparatus may comprise a substrate and a circuit board. A ball grid array structure may be disposed between the substrate and the circuit board. In addition, a stand-off structure may be disposed between the substrate and the circuit board. The stand-off structure may be adjacent to the ball grid array structure.

20 Claims, 6 Drawing Sheets

Related U.S. Application Data of application No. 14/048,069, filed on Oct. 8, 2013, now Pat. No. 9,282,649.

(51) Int. Cl.
*H01L 23/49* (2006.01)
*H05K 3/30* (2006.01)

(56) References Cited

U.S. PATENT DOCUMENTS

| | | | | |
|---|---|---|---|---|
| 5,831,441 A * | 11/1998 | Motooka | ............... | G01R 1/0433 324/756.07 |
| 5,841,194 A * | 11/1998 | Tsukamoto | ............ | H01L 23/145 257/729 |
| 6,143,981 A * | 11/2000 | Glenn | ................. | H01L 21/4842 174/534 |
| 6,239,383 B1 * | 5/2001 | Lin | .................... | H01L 23/49816 174/255 |
| 6,313,521 B1 * | 11/2001 | Baba | ..................... | H01L 21/563 257/659 |
| 6,316,735 B1 * | 11/2001 | Higashiguchi | ....... | H05K 3/3436 174/260 |
| 6,486,545 B1 * | 11/2002 | Glenn | ............... | H01L 23/49827 257/686 |
| 6,541,305 B2 * | 4/2003 | Farooq | ................ | H01L 21/6835 257/E21.508 |
| 6,653,170 B1 | 11/2003 | Lin | | |
| 7,005,326 B1 * | 2/2006 | Glenn | ............... | H01L 23/49548 257/E23.046 |
| 8,941,236 B2 * | 1/2015 | Limaye | .............. | H01L 23/49816 257/737 |
| 9,373,590 B1 * | 6/2016 | Interrante | .............. | H01L 23/562 |
| 9,786,520 B2 * | 10/2017 | Liu | ........................ | H01L 21/561 |
| 9,953,909 B2 * | 4/2018 | Liang | ...................... | H01L 23/13 |
| 2001/0054758 A1 * | 12/2001 | Isaak | ................... | H01L 25/0657 257/686 |
| 2003/0017654 A1 * | 1/2003 | Iwamoto | ............... | H01L 21/563 438/127 |
| 2004/0134680 A1 * | 7/2004 | Dai | ........................ | H05K 3/303 174/255 |
| 2004/0150118 A1 * | 8/2004 | Honda | ................. | H01L 21/563 257/778 |
| 2006/0043586 A1 * | 3/2006 | Chiu | ...................... | H05K 3/303 257/738 |
| 2006/0192293 A1 * | 8/2006 | So | .............. | H01L 23/40 257/778 |
| 2006/0231949 A1 * | 10/2006 | Park | .................. | H01L 23/49811 257/737 |
| 2006/0238990 A1 * | 10/2006 | Suhir | ............... | H01L 23/4006 361/760 |
| 2006/0267217 A1 * | 11/2006 | Wong | ................ | H01L 23/49811 257/779 |
| 2007/0069378 A1 * | 3/2007 | Park | ...................... | H05K 3/303 257/737 |
| 2007/0210437 A1 * | 9/2007 | Noma | ................. | H01L 21/6835 257/690 |
| 2007/0274060 A1 * | 11/2007 | Kiuchi | .................... | H01L 23/10 361/820 |
| 2008/0093733 A1 * | 4/2008 | Hsu | ....................... | H01L 21/563 257/722 |
| 2008/0150157 A1 * | 6/2008 | Nishimura | .............. | H01L 24/13 257/777 |
| 2009/0057891 A1 * | 3/2009 | Nishimura | .............. | H01L 24/29 257/737 |
| 2009/0206481 A1 * | 8/2009 | Chiang | ................... | H01L 23/13 257/738 |
| 2009/0218680 A1 * | 9/2009 | Celik | ...................... | H01L 23/10 257/712 |
| 2009/0244860 A1 * | 10/2009 | Watanabe | .......... | H01L 23/4985 361/749 |
| 2010/0025844 A1 * | 2/2010 | Yamazaki | ........... | H01L 21/6835 257/693 |
| 2010/0314741 A1 * | 12/2010 | Lee | ......................... | H01L 21/56 257/687 |
| 2011/0039375 A1 * | 2/2011 | Nakagawa | ........ | H01L 23/49811 438/121 |
| 2011/0084375 A1 * | 4/2011 | Eu | .......................... | H05K 1/141 257/690 |
| 2012/0018871 A1 * | 1/2012 | Lee | ..................... | H01L 25/0655 257/698 |
| 2012/0181679 A1 * | 7/2012 | Kadoguchi | ......... | H01L 23/3142 257/676 |
| 2013/0115735 A1 * | 5/2013 | Chen | ...................... | B29C 43/18 438/108 |
| 2013/0147026 A1 * | 6/2013 | Topacio | .................. | H01L 23/36 257/698 |
| 2013/0193575 A1 * | 8/2013 | Shen | ................... | H01L 23/3128 257/751 |
| 2013/0292831 A1 * | 11/2013 | Liu | ...................... | H01L 23/488 257/738 |
| 2013/0320572 A1 * | 12/2013 | Chang | ............... | H01L 21/56 257/787 |
| 2014/0252634 A1 * | 9/2014 | Hung | ..................... | H01L 23/48 257/773 |
| 2015/0011039 A1 * | 1/2015 | Furihata | ................ | H01L 31/048 438/67 |
| 2015/0061162 A1 * | 3/2015 | Yu | ........................ | H01L 25/0652 257/787 |
| 2015/0096787 A1 * | 4/2015 | Perng | ..................... | H05K 3/303 174/250 |
| 2015/0214074 A1 * | 7/2015 | Liu | ........................ | H01L 23/24 257/692 |
| 2018/0019193 A1 * | 1/2018 | Liang | ..................... | H01L 23/13 |

* cited by examiner

STAND-OFF BLOCK

RELATED APPLICATIONS

This application is a Division of co-pending U.S. application Ser. No. 15/014,111 entitled "Stand-Off Block" filed Feb. 3, 2016, which is a Division of U.S. application Ser. No. 14/048,069 entitled "Stand-Off Block" filed Oct. 8, 2013, now U.S. Pat. No. 9,282,649, both of which are incorporated herein by reference.

TECHNICAL FIELD

The present disclosure relates generally to ball grid array (BGA) solder joint bridging prevention.

BACKGROUND

A ball grid array (BGA) is a type of surface-mount packaging used for integrated circuits. BGA packages are used to permanently mount devices such as microprocessors. A BGA can provide more interconnection pins than can be put on a dual in-line or flat package. The whole bottom surface of the device can be used, instead of just the perimeter. The leads are also on average shorter than with a perimeter-only type, leading to better performance at high speeds.

The BGA is descended from the pin grid array (PGA). PGA is a package with one face covered (or partly covered) with pins in a grid pattern which, in operation, conduct electrical signals between an integrated circuit and a printed circuit board (PCB) on which it is placed. Soldering of BGA devices requires control and is usually done by automated processes. BGA devices are not suitable for socket mounting.

BRIEF DESCRIPTION OF THE DRAWINGS

The accompanying drawings, which are incorporated in and constitute a part of this disclosure, illustrate various embodiments of the present disclosure. In the drawings.

DETAILED DESCRIPTION

Overview

Figure 1:
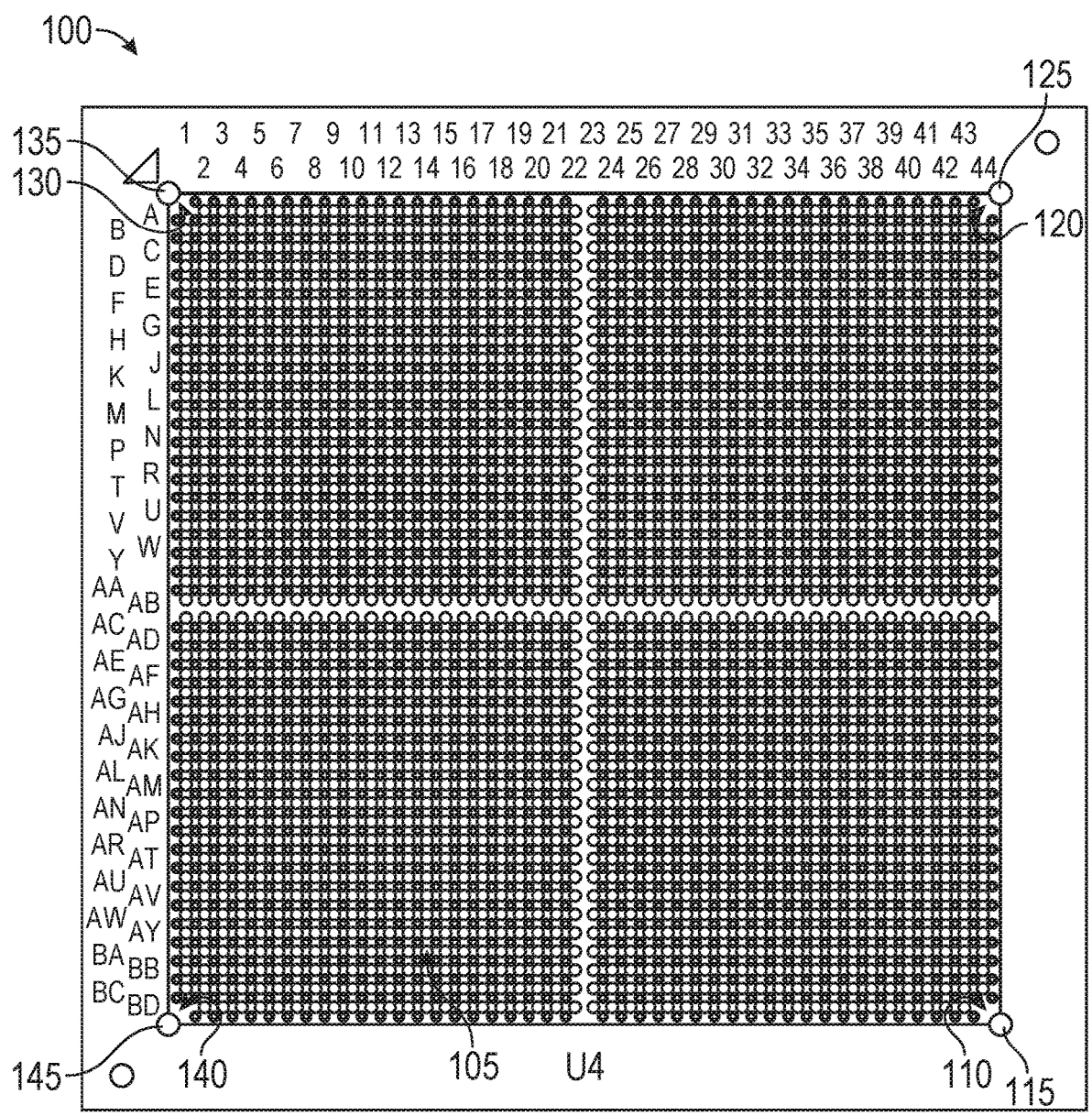
FIG. 1 shows a circuit board with a ball grid array.

An apparatus may be provided. The apparatus may comprise a substrate and a circuit board. A ball grid array structure may be disposed between the substrate and the circuit board. In addition, a stand-off structure may be disposed between the substrate and the circuit board. The stand-off structure may be adjacent to the ball grid array structure.

Both the foregoing overview and the following example embodiment are examples and explanatory only, and should not be considered to restrict the disclosure's scope, as described and claimed. Further, features and/or variations may be provided in addition to those set forth herein. For example, embodiments of the disclosure may be directed to various feature combinations and sub-combinations described in the example embodiment.

EXAMPLE EMBODIMENTS

The following detailed description refers to the accompanying drawings. Wherever possible, the same reference numbers are used in the drawings and the following description to refer to the same or similar elements. While embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the appended claims.

BGA packaging may be a solution to the problem of producing a miniature package for an integrated circuit with many hundreds of pins. Conventional PGA and dual-in-line surface mount (SOIC) packages are being produced with more and more pins and with decreasing spacing between the pins. The decreased space between the pins in PGA and SOIC causes problems for the soldering process. These problems may include the danger of accidentally bridging adjacent pins with solder. While BGAs may be less susceptible to these problems than PGAs or SOICs, the problem of corner bridging may occur during a reflow process with BGAs.

In BGA, pins used in PGA are replaced by pads on the bottom of a substrate. Each pad initially has a small spherically shaped solder balls stuck to it with a tacky flux for example. These solder balls may be placed manually or by automated equipment. The substrate may then be placed on a Printer Circuit Board (PCB) to form an assembly. The PCB may have pads (e.g., copper) in a pattern (e.g., a ball grid array) that may be aligned with the solder balls on the substrate. Using a reflow process, the assembly may then be heated, either in a reflow oven or by an infrared heater, to melt the solder balls. Surface tension may cause the molten solder to hold the substrate in alignment with the PCB, at the correct separation distance, while the solder cools and solidifies, forming soldered connections between the substrate and the PCB.

Due to a Coefficient of Thermal Expansion (CTE) mismatch between materials used in the substrate such as the substrate material, molding compound, and silicon chip, BGA components (e.g., the substrate) may have a certain degree of warpage during and at the end of the reflow process. BGA component warpage may affect both an assembly yield and a long term reliability performance. Excessive warpage, particularly for large size BGA components, may lead to corner bridging defects. In some cases, excessive warpage may even cause Head-In-Pillow defects, which may be difficult to detect and may become problematic in the field.

Corner bridging defects caused by the aforementioned warpage may comprise two or more solder balls (e.g., at or near a corner) touching each other during the reflow process and thus shorting. This touching may result from the aforementioned substrate warping (e.g., during the reflow process) that may squeezing two or more solder balls together to touch. Consistent with embodiments of the disclosure, one or more stand-off blocks may be provided in the assembly that may mitigate the effects of the aforementioned warpage and eliminate the aforementioned solder ball touching during the reflow process.

Figure 2:
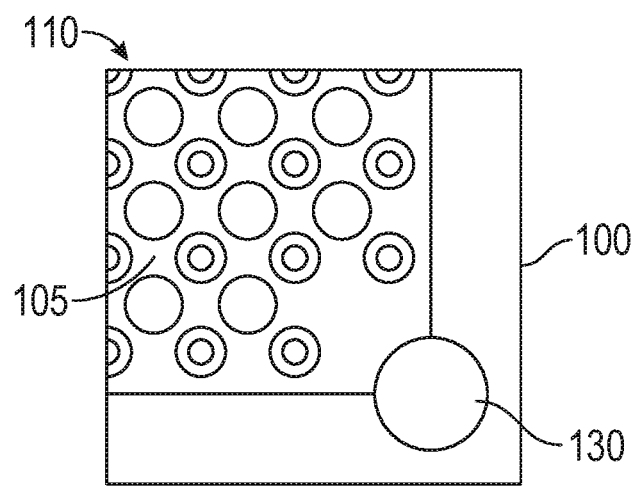
FIG. 2 shows a corner of a circuit board with a ball grid array.

FIG. 1 shows a circuit board 100. As shown in FIG. 1, circuit board 100 may include a ball grid array 105. Ball grid array 105 may comprise a first ball grid array corner 110 with a first stand-off structure pad 115, a second ball grid array corner 120 with a second stand-off structure pad 125, a third ball grid array corner 130 with a third stand-off structure pad 135, and a fourth ball grid array corner 140 with a fourth stand-off structure pad 145. FIG. 2 shows first ball grid array corner 110 in greater detail.

Ball grid array 105 may comprise a plurality of pads (e.g., copper) in a pattern that may be aligned with solder balls on a substrate to form an assembly. Each of first stand-off structure pad 115, second stand-off structure pad 125, third stand-off structure pad 135, and fourth stand-off structure pad 145 may be used as a base on which to build a stand-off structure consistent with embodiments of the disclosure. First stand-off structure pad 115, second stand-off structure pad 125, third stand-off structure pad 135, and fourth stand-off structure pad 145 may have, for example, a diameter of 25 mil, 35 mil, 45 mil, or 55 mil within a tolerance of 1 mil. First stand-off structure pad 115, second stand-off structure pad 125, third stand-off structure pad 135, and fourth stand-off structure pad 145 are not limited to the aforementioned diameters and may comprise any diameter. First stand-off structure pad 115, second stand-off structure pad 125, third stand-off structure pad 135, and fourth stand-off structure pad 145 may be placed on circuit board 100 in the same manner and using the same process as placing the plurality of pads of ball grid array 105 on circuit board 100.

Figure 3A:
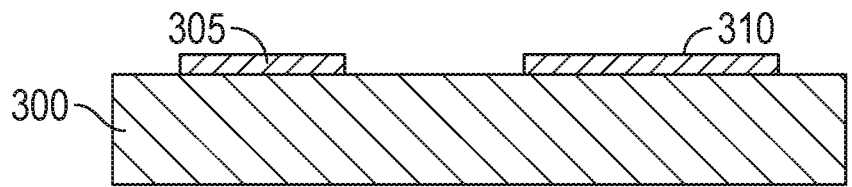
FIGS. 3A through 3C show a ball grid array structure and a stand-off structure.
Figure 3B:
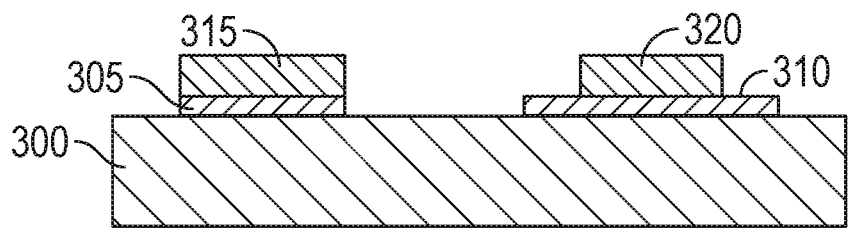
Figure 3C:
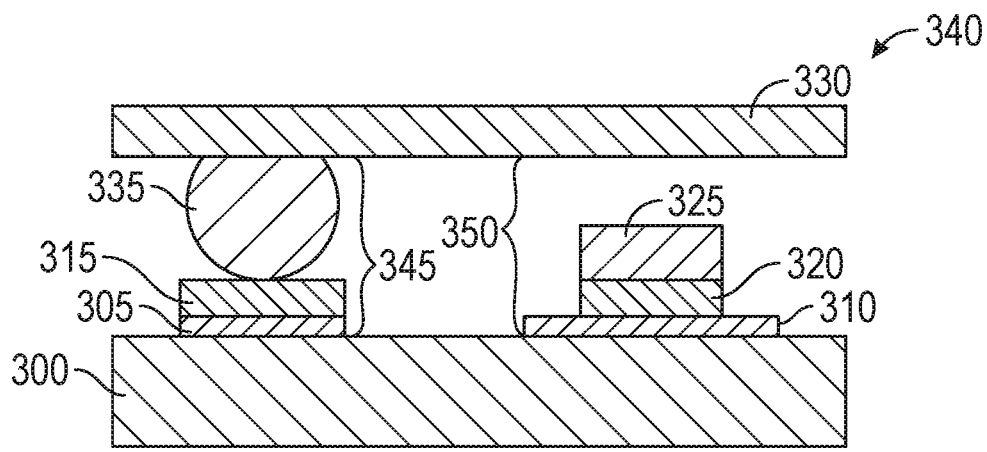

FIGS. 3A through 3C show a ball grid array structure and a stand-off structure. As shown in FIG. 3A, a circuit board 300 may include a ball grid array structure pad 305 and a stand-off structure pad 310. Circuit board 300 may be similar to circuit board 100 of FIG. 1. Moreover, ball grid array structure pad 305 may be similar to any of the plurality of pads in ball grid array 105 of FIG. 1. In addition, stand-off structure pad 310 may be similar to any of first stand-off structure pad 115, second stand-off structure pad 125, third stand-off structure pad 135, and fourth stand-off structure pad 145 of FIG. 1. As shown in FIG. 3B, ball grid array structure solder section 315 and stand-off structure solder section 320 may printed as a solder paste onto ball grid array structure pad 305 and stand-off structure pad 310 respectively.

After ball grid array structure solder section 315 and stand-off structure solder section 320 are added, a block 325 may be placed on stand-off structure solder section 320. For example, block 325 may come in tape and reel form and may be placed by an inline high speed placement machine in a similar way in which other elements may be added to circuit board 100 or circuit board 300. Block 325, for example, may have a height of 8 mil+/−1 mil, 11 mil+/−1 mil, 12 mil+/−1 mil, or 16 mil+/−1 mil. The aforementioned heights are examples and block 325 may have any height. In addition, block 325, for example, may have a diameter of 24 mil+/−1 mil or 30 mil+/−1 mil. The aforementioned diameters are examples and block 325 may have any diameter.

Block 325, for example, may comprise nickel plated with gold or may comprises copper plated with tin and gold (e.g., Sn96Au4) on a top surface of block 325 and on a bottom surface of block 325. The aforementioned materials are examples and block 325 may comprise any material. Block 325 may be cylindrical or may comprise any shape.

Substrate 330 may comprise an electric chip, for example, a microprocessor or an Application-Specific Integrated Circuit (ASIC). Pads (not shown) may be located on the bottom of substrate 330. One of the aforementioned pads may have a small spherically shaped solder ball (e.g., a solder ball 335) stuck to it with a tacky flux for example. Solder ball 335 may be placed manually or by automated equipment. Substrate 330 may be placed on circuit board 300 to form an assembly 340. Ball grid array structure pad 305 on circuit board 300 may be aligned with solder ball 335 on substrate 330. Ball grid array structure pad 305, ball grid array structure solder section 315, and solder ball 335 may combine to form a ball grid array structure 345. Stand-off structure pad 310, stand-off structure solder section 320, and block 325 may combine to form a stand-off structure 350.

Figure 4:
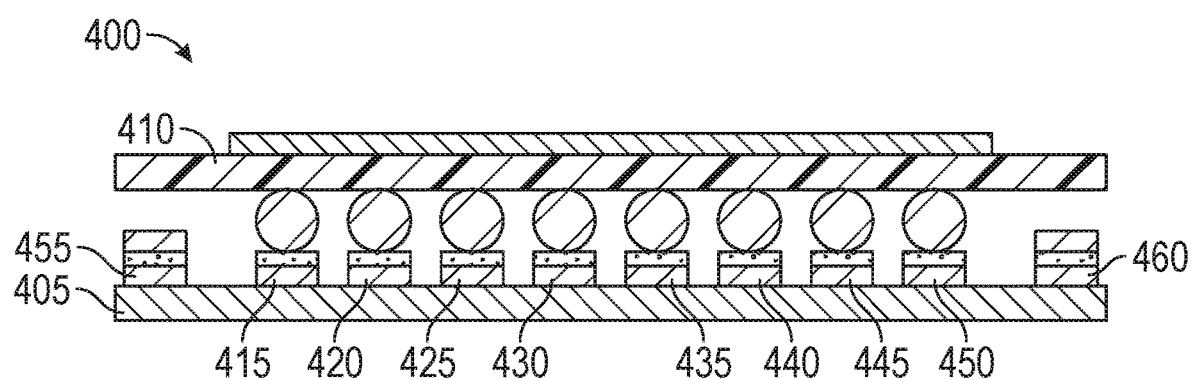
FIG. 4 shows a surface mount assembly before reflow.

FIG. 4 shows a surface mount assembly 400 before reflow. As shown in FIG. 4, surface mount assembly 400 may a comprise a circuit board 405 and a substrate 410. Circuit board 405 may be similar to circuit board 100 and circuit board 300 described above. In addition, substrate 410 may be similar to substrate 330 described above.

A plurality of ball grid array structures may be disposed between circuit board 405 and substrate 410. Each of the plurality of ball grid array structures may be similar to ball grid array structure 345. The plurality of ball grid array structures may comprise, a first ball grid array structure 415, a second ball grid array structure 420, a third ball grid array structure 425, a fourth ball grid array structure 430, a fifth ball grid array structure 435, a sixth ball grid array structure 440, a seventh ball grid array structure 445, and an eighth ball grid array structure 450.

A plurality of stand-off structures may be disposed between circuit board 405 and substrate 410. Each of the plurality of stand-off structures may be similar to stand-off structure 350. The plurality of stand-off structures may comprise a first stand-off structure 455 and a second stand-off structure 460. Any of the plurality of stand-off structures may be placed at a corner of a ball grid array, for example, at first ball grid array corner 110, second ball grid array corner 120, third ball grid array corner 130, or fourth ball grid array corner 140. As shown in FIG. 4, ball grid array structure pads on circuit board 405 may be aligned with the solder balls of substrate 410.

Figure 5:
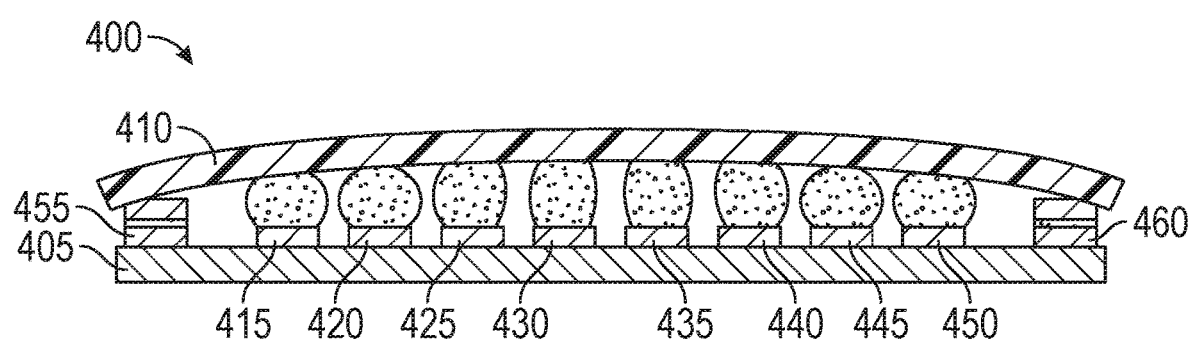
FIG. 5 shows a surface mount assembly during reflow.

FIG. 5 shows surface mount assembly 400 during reflow. Using a reflow process, assembly 400 may then be heated, either in a reflow oven or by an infrared heater for example, to melt the solder balls. Surface tension may cause the molten solder to hold substrate 410 in alignment with circuit board 405, at the correct separation distance, while the solder cools and solidifies, forming soldered connections between substrate 410 and circuit board 405.

Due to CTE mismatch between materials used in substrate 410 such as the substrate material, molding compound, and silicon chip, substrate 410 may have a certain degree of warpage during and at the end of the reflow process as shown in FIG. 5. This warpage may in turn cause damage due to corner bridging. Consistent with embodiments of the disclosure, first stand-off structure 455 and second stand-off structure 460 may prevent corner bridging.

Corner bridging damage caused by the aforementioned warpage may comprise two or more solder balls (e.g., in first ball grid array structure 415 and second ball grid array structure 420) touching each other during the reflow process and thus causing an electrical short. This touching may result from the aforementioned substrate warping (e.g., during the reflow process) that may be squeezing two or more solder balls together to touch. Consistent with embodiments of the disclosure, first stand-off structure 455 may prevent substrate 410 from bending down far enough to squeeze the solder balls of first ball grid array structure 415 and second ball grid array structure 420 together during reflow. Similarly, second stand-off structure 460 may prevent substrate 410 from bending down far enough to squeeze the solder balls of eighth ball grid array structure 450 and seventh ball grid array structure 445 together during reflow. Consistent with embodiments of the disclosure, first stand-off structure 455 and second stand-off structure 460 may prevent corner bridging damage.

Figure 6:
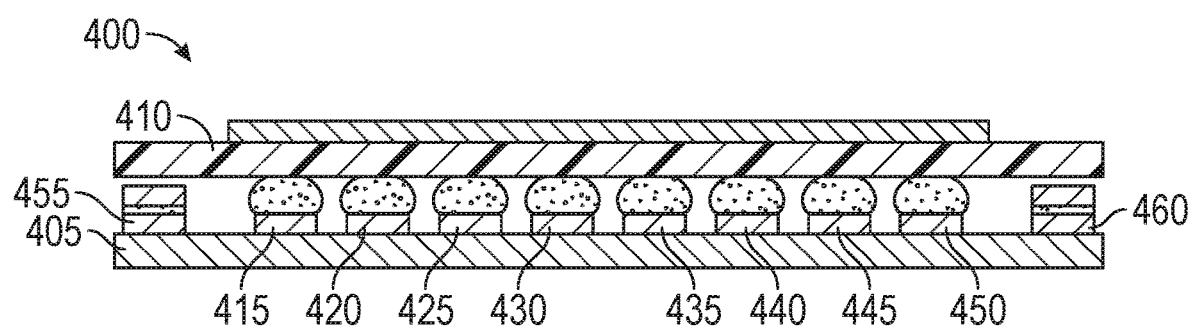
FIG. 6 shows a surface mount assembly after reflow.

FIG. 6 shows surface mount assembly 400 after reflow. After the reflow process, substrate 410's warpage may dissipate and substrate 410 may return to its normal shape. As shown in FIG. 6, because of the presence of first stand-off structure 455, substrate 410 may have been prevented from bending down far enough to squeeze the solder balls of first ball grid array structure 415 and second ball grid array structure 420 together during reflow. Consequently, after reflow, there may be sufficient space between the solder balls of first ball grid array structure 415 and second ball grid array structure 420. Accordingly, there may be no electrical short between the solder balls of first ball grid array structure 415 and second ball grid array structure 420 when assembly 400 cools after reflow.

Moreover, because of the presence of second stand-off structure 460, substrate 410 may have been prevented from bending down far enough to squeeze the solder balls of eighth ball grid array structure 450 and seventh ball grid array structure 445 together during reflow. Consequently, after reflow, there may be sufficient space between the solder balls of eighth ball grid array structure 450 and seventh ball grid array structure 445. Accordingly, there may be no electrical short between the solder balls of eighth ball grid array structure 450 and seventh ball grid array structure 445 when assembly 400 cools after reflow.

Embodiments of the disclosure may use a high speed inline placer to pick a block, place it on a pad at a corner of a BGA, and reflow the BGA to maintain a minimum stand-off height and prevent subsequent corner bridging. The block may comprise a cylindrical disk to be placed on a designed-in pad at the corner of the BGA to prevent corner bridging by maintaining a minimum stand-off height.

To implement the block, one or more pads may be added in each of the four corners of the BGA. After paste printing, the block may be picked and placed on a pasted pad, prior to placing the BGA component. Then the BGA component may go into a reflow oven. The block may then be soldered to the pad during reflow. In case the BGA component has corner warpage, the block may provide a minimum stand-off to keep the BGA from corner bridging.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While the specification includes examples, the disclosure's scope is indicated by the following claims. Furthermore, while the specification has been described in language specific to structural features and/or methodological acts, the claims are not limited to the features or acts described above. Rather, the specific features and acts described above are disclosed as example for embodiments of the disclosure.

What is claimed is:

1. An apparatus comprising:
   a substrate comprising an electric chip;
   a circuit board;
   a first ball grid array structure disposed between the substrate and the circuit board, the first ball grid array structure comprising a first ball grid array structure pad, a first ball grid array solder section, and a first solder ball, the first ball grid array solder section placed between the first ball grid array structure pad and first solder ball;
   a second ball grid array structure disposed between the substrate and the circuit board, the second ball grid array structure comprising a second ball grid array structure pad, a second ball grid array solder section, and a second solder ball, the second ball grid array solder section placed between the second ball grid array structure pad and second solder ball, the second ball grid array structure being adjacent to the first ball grid array structure; and
   a stand-off structure disposed between the substrate and the circuit board, the stand-off structure being adjacent to the first ball grid array structure the stand-off structure comprising a stand-off structure pad, a stand-off structure solder section and a block, the stand-off structure solder placed between the stand-off structure pad and the block, a stand-off structure height configured to bridging between the first ball grid array structure and the second ball grid array structure during reflow.

2. The apparatus of claim 1, wherein the circuit board comprises a printed circuit board.

3. The apparatus of claim 1, wherein the block has a diameter in a range from about 23 mils to about 25 mils.

4. The apparatus of claim 1, wherein the block has a diameter in a range from about 29 mils to about 31 mils.

5. The apparatus of claim 1, wherein the block has a height in a range from about 7 mils to about 9 mils.

6. The apparatus of claim 1, wherein the block has a height in a range from about 10 mils to about 12 mils.

7. The apparatus of claim 1, wherein the block has a height in a range from about 11 mils to about 13 mils.

8. The apparatus of claim 1, wherein the block has a height in a range from about 15 mils to about 17 mils.

9. The apparatus of claim 1, wherein the block comprises nickel plated with gold.

10. The apparatus of claim 1, wherein the block comprises copper plated with tin and gold.

11. The apparatus of claim 1, wherein the block comprises copper plated with tin and gold on a top surface of the block and on a bottom surface of the block.

12. The apparatus of claim 1, wherein the stand-off structure is disposed at corner of a ball grid array in which the first ball grid array structure is disposed and in which the second ball grid array structure is disposed.

13. An apparatus comprising:
   a substrate comprising an electric chip;
   a circuit board;
   a first ball grid array structure disposed between the substrate and the circuit board, the first ball grid array structure comprising a first ball grid array structure pad, a first ball grid array solder section, and a first solder ball, the first ball grid array solder section placed between the first ball grid array structure pad and first solder ball;
   a second ball grid array structure disposed between the substrate and the circuit board, the second ball grid array structure comprising a second ball grid array structure pad, a second ball grid array solder section, and a second solder ball, the second ball grid array solder section placed between the second ball grid array structure pad and second solder ball, the second ball grid array structure being adjacent to the first ball grid array structure; and a stand-off structure disposed between the substrate and the circuit board, the stand-off structure being adjacent the first ball grid array structure, wherein the stand-off structure comprises a stand-off structure pad, a stand-off structure solder section and a block, the stand-off structure solder placed between the stand-off structure pad and the block.

14. The apparatus of claim 13, wherein the stand-off structure is disposed at corner of a ball grid array in which the first ball grid array structure is disposed.

15. The apparatus of claim 13, wherein the block is soldered to the stand-off structure solder section.

16. An apparatus comprising:
a substrate comprising an electric chip;
a circuit board;
a ball grid array structure disposed between the substrate and the circuit board, the ball grid array structure comprising a first ball grid array structure pad, a first ball grid array solder section, and a first solder ball, the first ball grid array solder section placed between the first ball grid array structure pad and first solder ball; and a stand-off structure disposed between the substrate and the circuit board, the stand-off structure being adjacent to the ball grid array structure, wherein the stand-off structure comprises a stand-off structure pad, a stand-off structure solder section and a block, the stand-off structure solder placed between the stand-off structure pad and the block, the stand-off structure having a stand-off structure height configured to prevent bridging during reflow.

17. The apparatus of claim 16, wherein the stand-off structure is disposed at corner of a ball grid array in which the first ball grid array structure is disposed.

18. The apparatus of claim 16, wherein the circuit board comprises a printed circuit board.

19. The apparatus of claim 16, wherein the block comprises a cylindrical disk.

20. The apparatus of claim 16, wherein the block is soldered to the stand-off structure solder section.

* * * * *